United States Patent
Johnson et al.

(10) Patent No.: US 7,102,430 B2
(45) Date of Patent: Sep. 5, 2006

(54) EFFICIENT METHOD AND MEANS FOR INTEGRATION OF POWER CONTROL AND PREDISTORTION IN A TRANSMITTER

(75) Inventors: Michael P. Johnson, Poway, CA (US); Michael S. Andrews, Escondido, CA (US); Robert A. Bramble, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 58 days.

(21) Appl. No.: 11/038,928

(22) Filed: Jan. 18, 2005
(Under 37 CFR 1.47)

(65) Prior Publication Data

US 2006/0158254 A1    Jul. 20, 2006

(51) Int. Cl.
*H03F 1/26* (2006.01)
(52) U.S. Cl. .................................... 330/149
(58) Field of Classification Search ................ 330/149; 455/114.3; 375/296–297
See application file for complete search history.

(56) References Cited

U.S. PATENT DOCUMENTS

2005/0057303 A1* 3/2005 Leffel ........................ 330/75

* cited by examiner

*Primary Examiner*—Robert Pascal
*Assistant Examiner*—Hieu Nguyen
(74) *Attorney, Agent, or Firm*—Carmen B. Patti & Assoc., LLC

(57) ABSTRACT

A radio-frequency (RF) transmitter power amplifier circuit provides for practically linear performance by predistorting the amplifier input signals to compensate for amplifier distortion at high power levels, and provides a fine degree of control of amplifier power needed to handle complex modulation schemes with widely and rapidly varying power requirements. A predistortion database (20) contains gain and phase corrections for various transmission types and a separate automatic gain control database (38) contains fine amplifier gain corrections. A real-time processor (26) combines the two types of corrections and applies them to the amplifier input signals, and a background processor (16) continually updates both databases in accordance with a programmable priority scheme. Integration of predistortion and amplifier power control is achieved in a manner that minimizes adverse effects of one type of control on the other. One feature of the invention provides for rapid convergence of the predistortion correction.

13 Claims, 4 Drawing Sheets

EFFICIENT METHOD AND MEANS FOR INTEGRATION OF POWER CONTROL AND PREDISTORTION IN A TRANSMITTER

BACKGROUND OF THE INVENTION

This invention relates generally to radio-frequency (RF) power amplifiers and, more particularly, to techniques for combining power control and predistortion in RF power amplifiers used in communication systems. RF power amplifiers are typically the most expensive single components of transmit sub-systems. The cost of the amplifier is proportional to the amount of power that it is required to produce. For this reason, and to improve amplifier efficiency, it is often a design goal to operate each power amplifier as close as possible to its maximum power level. Unfortunately, power amplifiers do not behave in a perfectly linear fashion all the way up to their maximum power levels. That is to say, the amplifier power output is not exactly proportional to the amplifier input for all power levels. Typically, the relationship between output and input power is linear over a range of relatively low power levels but becomes nonlinear at higher power levels. One solution to this problem is to select an amplifier of larger maximum power and to "back off" the amplifier such that it always operates in the linear range. This approach obviously imposes a significant cost penalty.

Predistortion of the amplifier input is a better solution for compensating for nonlinearity of a power amplifier. Basically, predistortion involves applying a nonlinear correction to the amplifier input signals, such that the predistortion correction exactly compensates for the nonlinearity of the amplifier, and the amplifier output is linearly related to the input all the way up to the amplifier's maximum power level. Predistortion is sometimes referred to as "linearization." Because amplifier nonlinearity affects the phase of the output signal as well as the amplitude, predistortion involves phase correction as well as amplitude correction of the input signal. In other words, predistortion requires a complex multiplication of the input signal by a complex correction factor.

One reason that predistortion or linearization is so important is that power amplifiers used in modern communication systems do not operate at constant power levels. Many of today's complex modulation schemes result in communication waveforms that do not have a constant power envelope. Typically, the signal power varies across a significant dynamic range of several decibels (dB) or more. As a result, the power amplifier must not only be able to transmit a specific amount of power at any instant of time, but it must reproduce the signal with very little nonlinear distortion in order to pass stringent governmental guidelines. Nonlinearity results in unwanted intermodulation products that interfere with adjacent channels. In the United States, for example, the Federal Communications Commission (FCC) has imposed guidelines regarding signal fidelity and adjacent channel power.

A related requirement for transmitter power amplifiers is that a transmitter must typically also control its output power to a very fine degree, even down to tenths of a deciBel (dB). This requirement exists independently of the requirement for linearity. Yet, because predistortion inherently involves amplitude and phase correction, the dual requirements of nonlinearity compensation and fine power control are closely related. A necessary attribute of fine power control is that it must simultaneously co-exist with the predistortion control.

There are numerous methods of predistortion. By way of example, one method of the prior art is shown in U.S. Pat. No. 6,236,837 B1, issued to Pallab Midya. The Midya technique is typical of those in which one has access to a "reference waveform" (i.e., the originally generated baseband waveform before upconversion and amplification). The technique involves detecting the power amplifier output, downconverting the output signal to baseband, and comparing this "transmit waveform" to the reference waveform. The resulting amplitude and phase errors are inverted and fed back to subsequently transmitted signals.

The requirement to have both power control and predistortion successfully co-exist presents several challenges and problems. FIG. 1 is a block diagram of an exemplary adaptive digital predistortion system that represents the current state of the art in predistortion approaches for communication systems. An RF power amplifier 10 generates an output on line 12, a sample of which is obtained through a coupler 13 and fed to a demodulator 14 that separates provides in-phase (I) and quadrature (Q) components of the demodulated output signal, referred to as a transmit burst. These signal components are input to a background processor 16, which also receives corresponding components of a reference burst from a waveform generator 18. The principal task of the background processor 16 is to continually update a predistortion database 20, which contains correction factors to be applied to the input signals. The waveform generator 18 supplies input signals to a complex multiplier 22, the outputs of which are supplied to a transmit chain 24, and from there are input to the power amplifier 10. When the amplifier 10 is operating in its linear range, the complex multiplier 22 has an insignificant effect on the input signals, which are passed through the transmit chain 24 to the power amplifier 10. A real-time processor 26 uses information from the predistortion database 20 to compute an appropriate complex multiplier to be applied to the input signals from the waveform generator 18. The predistortion correction is applied in the complex multiplier 22. Depending on the initial conditions and on the specific control algorithm employed in the real-time processor 26, linearization of the amplifier 10 may take multiple iterations of the control loop described. The amplifier 10 is an analog device but, for reasons of convenience and economy, predistortion is best implemented with digital components. The necessary digital-to-analog and analog-to-digital conversions are omitted from FIG. 1 for simplicity.

Not shown in FIG. 1 is any method of controlling the transmit output power. In a typical multi-channel operating environment, not only must the predistortion system be able to apply the correct amount of nonlinear compensation, but the amplifier must also have some means for linear gain compensation for each channel. Fundamental considerations in the design of a power control sub-system include the ability to compensate for the small signal gain variation across the frequency operating band (from channel to channel) and the ability to ensure stability in the combination of gain correction with predistortion.

Approaches for combining adaptive power control with adaptive digital predistortion have focused on autonomous power control. In autonomous power control, a traditional approach to controlling transmit output power is used in a system employing predistortion. Typically, the power amplifier output is coupled to a calibrated power detector, which feeds a compensation circuit, including such components as RF attenuators, a variable gain amplifier, and/or a digital baseband gain block. One drawback of this approach is that it requires additional hardware, which increases the product cost and complexity. A more subtle complication is the potential for system instability due to the predistortion nonlinear gain correction. A momentary improper power control setting can result in a significantly erroneous error array used for the predistortion update, which in turn can result in an incorrect nonlinear gain setting, which would improperly affect the output power. Another difficulty can arise if, for example, the system temperature changes during a period of system inactivity. Both the power control and predistortion settings would initially be incorrect and would have to independently converge. This convergence at best would require many adaptive iterations, resulting in a period of poor performance, and at worst the system could settle to an improper operating state.

It will be appreciated there is a significant need for an RF power amplifier circuit that effectively integrates amplifier predistortion with fine amplifier gain control. The present invention is directed to this end.

SUMMARY OF THE INVENTION

The present invention resides in a method and corresponding apparatus for compensating for nonlinear distortions in an RF amplifier, using a technique that efficiently integrates amplifier predistortion with amplifier gain control. The invention may be defined in terms of a method for integrating control of power and predistortion in a radio-frequency (RF) amplifier. Briefly, and in general terms, the method comprises the steps of retrieving a set of gain and attenuator settings from an automatic gain control (AGC) database that contains a different set of gain and attenuator settings for each transmission type; retrieving a set of predistortion parameters from a predistortion database that contains a different set of parameters for each transmission type; applying the attenuator setting to attenuators associated with the amplifier; combining the gain setting with the predistortion parameters to obtain a composite complex gain correction; applying the composite complex gain correction to amplifier input signals, to effect predistortion and amplifier gain control; continually updating the AGC and predistortion databases to reflect changes in amplifier performance due to aging and environmental conditions. The method may also include a step of storing initial values in the AGC database and the predistortion database, based on calibration of the amplifier after its manufacture.

More specifically, the step of continually updating the AGC database comprises sensing the amplifier power output level; comparing the amplifier power output level with a normalized power input level before the complex gain correction and attenuation, and generating from the comparison a power error; computing a power correction from the power error; retrieving a set of gain and attenuator settings from the AGC database; applying the power correction to the gain setting retrieved from the AGC database; adjusting the gain setting and associated attenuator setting to optimize the step of applying the composite complex gain correction; and saving the updated gain and attenuator settings back in the AGC database. The method may further comprise comparing the power error to a threshold level; and if the power error does not reach the threshold level, bypassing the remaining steps included in continually updating the AGC database.

An important additional step in the method is selecting, prior to the steps of continually updating, which database to update next, i.e., whether to update the AGC database or the predistortion database. This step may include selecting a database based on an absolute age parameter for each database, or some form of round-robin priority selection. In its simplest form, the selection may be simply based on alternating selection of the databases. Preferably, the step of selecting which database to update next also includes preferentially selecting the AGC database if the power error is above a programmable threshold.

The step of continually updating the predistortion database comprises demodulating a transmit burst of signals coupled from the amplifier output; comparing the demodulated transmit burst with a reference burst and computing from the comparison gain and phase errors; computing gain and phase corrections from the gain and phase errors; retrieving an appropriate portion of the predistortion database; applying the computed gain and phase corrections to the retrieved portion of the predistortion database; normalizing the gain correction applied to the predistortion database; and updating the predistortion database to include the normalized corrections.

Preferably, the method also comprises a step of comparing the generated errors to programmable threshold levels; and if the gain and phase errors are less than the threshold levels, i.e., the amplifier output is sufficiently linear, bypassing the remaining steps included in continually updating the predistortion database.

In accordance with an important feature of the invention, the step of computing gain and phase corrections comprises solving for $g(r)$ in the nonlinear equation $g(r \cdot f(r)) = f^{-1}(r)$; where $g(r)$ is the nonlinear gain function performed by predistortion, $f(r)$ is the nonlinear gain function of the RF amplifier, and $f^{-1}(r)$ is the inverse of the function $f(r)$. Solving this equation directly or indirectly provides a much more rapid convergence of the predistortion corrections on their values needed to achieve linearization of amplifier performance.

The invention may also be defined in apparatus terms, as a radio-frequency (RF) amplifier circuit having an integrated predistortion and power control architecture. The RF amplifier circuit comprises an automatic gain control (AGC) database that contains a different set of gain and attenuator settings for each amplifier gain level; a predistortion database that contains a different set of gain and phase corrections for each amplifier gain level; a waveform generator for generating power amplifier input signals; a complex multiplier for applying complex corrections to the input signals; a transmit chain including attenuators for further adjusting the input signals; a real-time processor for retrieving appropriate sets of correction data from the AGC database and the predistortion database, combining the correction data and applying correction signals to the complex multiplier and the attenuators; a power detector for generating a signal representative of the output power of the amplifier; a demodulator for demodulating samples of the amplifier; and a background processor for receiving output power signals from the power detector, transmit burst signals from the demodulator, and reference burst signals from the waveform generator, and for continually updating the AGC database and the predistortion database to reflect changes in amplifier performance due to aging and environmental conditions.

It will be appreciated from the foregoing that the present invention represents a significant advance in the field of RF power amplifiers. In particular, the invention provides a novel approach to integrating amplifier predistortion with fine control of amplifier power. Other aspects and advantages of the invention will become apparent from the following more detailed description, taken in conjunction with the accompanying drawings.

DETAILED DESCRIPTION OF THE INVENTION

Figure 1:
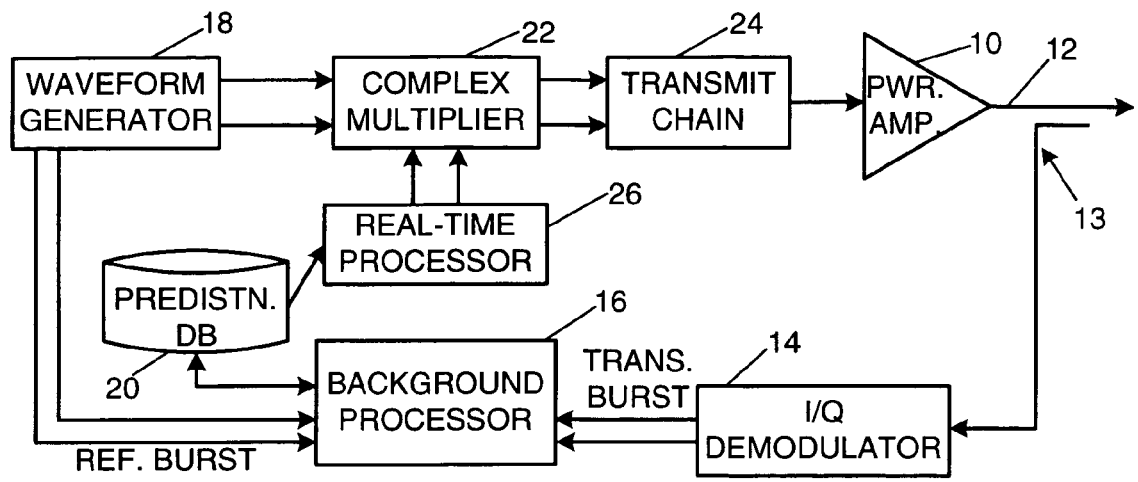
FIG. 1 is a block diagram of a typical prior art technique for predistortion of power amplifier input signals.

As shown in the drawings for purposes of illustration, the present invention pertains to radio-frequency (RF) power amplifiers used in RF transmitters in communication systems. As discussed above, there is a need for an integrated approach to implementing amplifier predistortion to compensate for nonlinearities and fine gain control of the amplifier. Prior approaches have typically added an autonomous gain control loop independent of the predistortion loop, but this not only results in increased cost and complexity, but results in poor performance and, in some cases, unwanted lack of convergence of the control loops.

A possible approach to integration of the two functions of predistortion and gain control is to modify the architecture illustrated in FIG. 1 to implement an integrated power control approach. For example, the demodulated power amplifier output generated by the I/O demodulator 14 may be calibrated to provide absolute output power information. Another approach would be to place a power detector (not shown in FIG. 1) at the coupler 13 output and feed the power detector output to the processor 16, again with calibration information. The calibrated output waveform may then be processed to obtain the proper gain (and phase) correction factor. In this case the gain correction factor simultaneously corrects for both nonlinear distortion and linear power control error. By integrating the control loops in this manner, the resulting system complexity and cost are reduced, and the potential for "fighting" convergence is removed.

A difficulty arises with the integrated approach described in the preceding paragraph because the predistortion update coefficients are more complicated than simple linear gain correction factors. By combining the control loops, the entire correction factor array would be repeated for the required channel spacing needed for power control. In a typical system, the gain of the transmit chain 24 may have significant (tenths of a dB) variation over frequencies either adjacent to a few channels away from a particular channel. Although the power amplifier 10 may have nonlinear characteristics which require perhaps only an order of magnitude less spacing, the integrated database would have to include memory for the full correction factors at the finer spacing required by power control. In this approach, a single update would change the predistortion coefficients only in that single group of channels, so the adjacent database parameters would not be updated. Because the predistortion updates are significantly more complicated than those of power control, the update process is relatively slow. These limitations compromise the cost savings gained from using the same hardware for both approaches.

Therefore, simple modification of the system of FIG. 1 to add power control in the manner described above is far from satisfactory. There is a need for a combined power control and pre-distortion system that integrates the two functions, both in real time operation and in background update operation, in a cost effective implementation while meeting stringent linearity, frequency spectrum, and power control specifications.

Figure 2:
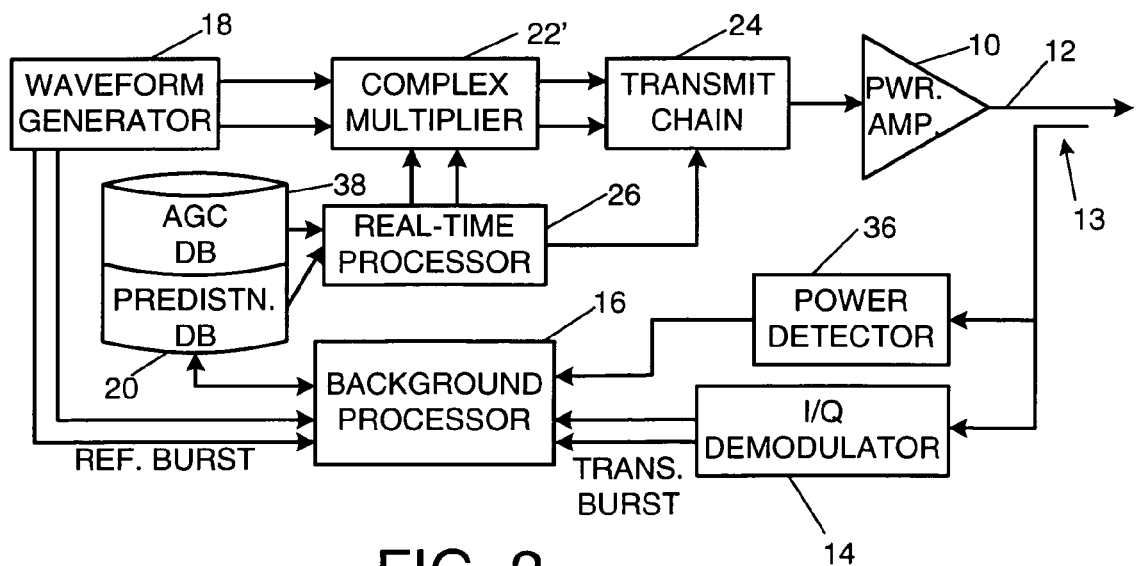
FIG. 2 is a block diagram depicting integration of amplifier predistortion and gain control in accordance with the present invention.

In accordance with the present invention, the functions of amplifier predistortion and gain control are integrated using a hybrid dual loop integrated power control architecture, as illustrated in block diagram form in FIG. 2. The predistortion control loop is similar in part to the one illustrated in FIG. 1, including an I/Q demodulator 14 to generate a sampled transmit burst to a background processor 16, which functions to update a predistortion database 20. A real-time processor 34 uses data from the predistortion database 20 to supply complex correction inputs to a complex multiplier 22', which functions to apply corrections, which include predistortion corrections, to the input signals applied to the power amplifier 10 through the transmit chain 24.

A gain control loop includes a power detector 36 that also receives output power from the coupler 13 and transmits a power level signal to the background processor 16. The background processor maintains an automatic gain control (AGC) database 38 independently of the predistortion database 20. The real-time processor 26 also has a dual function. In addition to computing predistortion corrections, the real-time processor 26 also computes linear gain corrections derived from the AGC database 38. The two types of corrections are combined and input to the complex multiplier 22'. The real-time processor 26 also generates attenuator control signals to be applied to attenuators in the transmit chain 24.

The invention will be better understood from a description of the functions performed by the real-time processor 26 and the background processor 16. In general, the real-time processor 26 computes amplifier input signal corrections based on the current contents of the AGC database 38 and the predistortion database 20. The AGC database 38 contains "fine" gain factor and attenuator settings for each of multiple frequencies of operation of the power amplifier 10. The gain factor information is "fine" in the sense that the AGC database 38 contains a relatively large number of sets of gain factor and attenuator settings, corresponding to many closely spaced frequencies. More generally, the AGC database 38 and the predistortion database 20 can be thought of as being indexed by the "transmission type" of the signal being processed. As used in this description, the term "transmission type" means any combination of signal parameters that affects power control and/or predistortion. In the context in which the present invention is disclosed, "transmission type" is characterized by frequency, which is why the terms "transmission type" and "frequency" are sometimes used interchangeably in this description, and why the AGC database 38 and the predistortion database 20 are sometimes described as being indexed by frequency. The AGC database 38 is capable of providing gain control to a very fine level of precision, thereby providing an extremely accurate and reliable degree of control of the output power of the amplifier 10. Initially, during manufacture, the AGC database is populated with values based on factory calibration of the amplifier performance. Once installed, however, the power amplifier 10 is subject to environmental and aging conditions that require the AGC database to be updated, and this is the principal function of the background processor 16.

Figure 3:
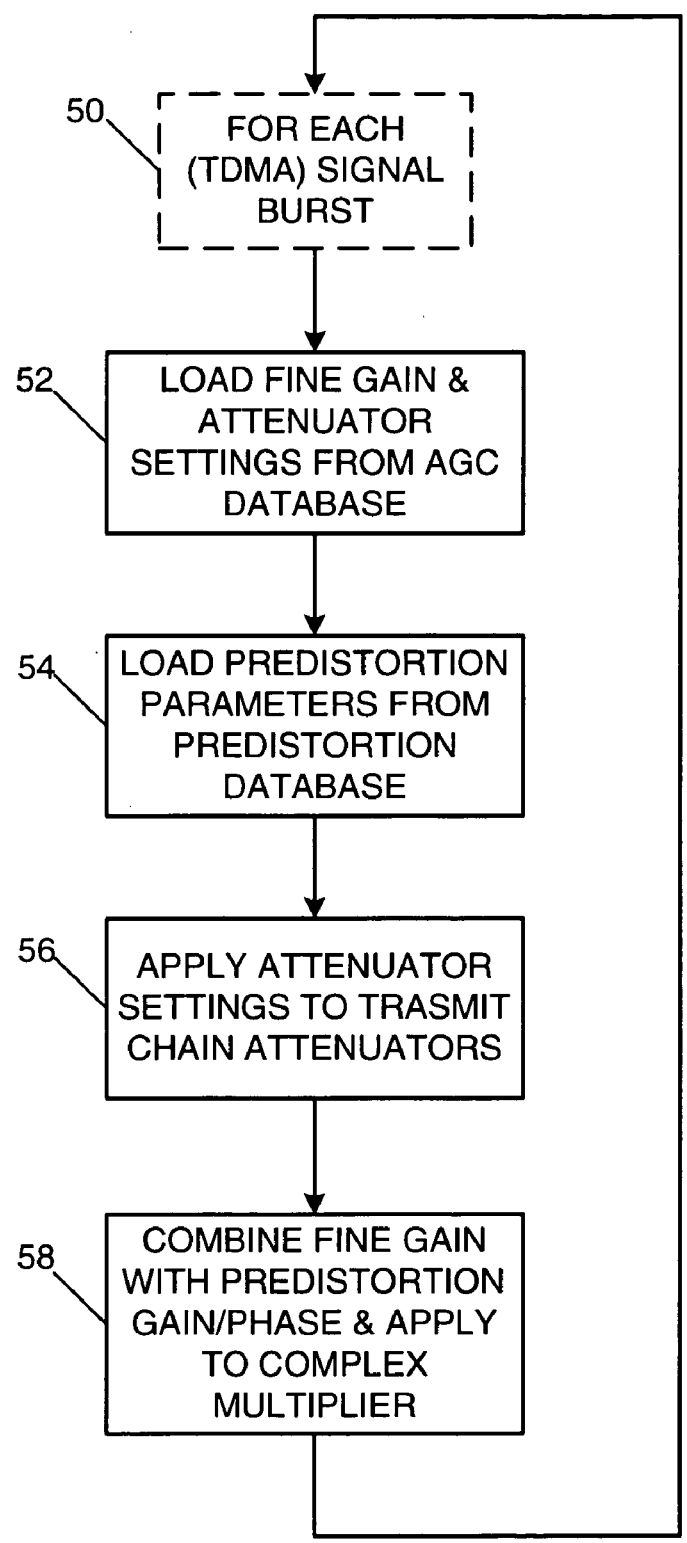
FIG. 3 is a flowchart showing the principal functions performed by a real-time processor of FIG. 2.

The real-time processor 26 generates a set of gain and attenuator settings and a set of predistortion corrections that change in "real time," but as a practical matter the real-time processor outputs are changed periodically rather than continuously. How frequently the real-time processor 26 outputs are updated depends, in part, on the nature of the waveform being transmitted. For example, in a communication system using time division multiple access (TDMA) technology, multiple digital signal streams associated with separate users are transmitted over a single channel by allocating to each user a unique time slot (in a sequence of time slots). Therefore, a channel using TDMA technology transmits a sequence of signals in successive time slots, each slot pertaining to a different user's data and the signals in each slot being transmitted at not necessarily the same frequency. In other words, each successive TDMA slot may be associated with a different transmission type. The real-time processor 26 is configured to generate a possibly different set of gain and attenuator corrections and predistortion corrections for each TDMA transmission type, as indicated in the comment in block 50 of FIG. 3.

The first step performed by the real-time processor 26 in updating the gain and attenuator settings and the predistortion corrections is to load the fine gain and attenuator settings from the AGC database 38, as indicated in block 52. As mentioned above, the AGC database 38 contains a different set of fine gain and attenuator settings for each transmission type. The real-time processor 26, therefore, retrieves the settings from the AGC database 38 based on the current power step setting of the amplifier 10. Next, as indicated in block 54, the real-time processor 26 retrieves a set of predistortion parameters from the predistortion database 20. Again, there is in general a different set of predistortion parameters for each transmission type. Next, as indicated in block 56, the real-time processor 26 applies the attenuator settings to the attenuators contained in the transmit chain 24. Finally, the processor combines the fine gain adjustments retrieved from the AGC database 38 with the predistortion parameters retrieved from the predistortion database 20 and outputs the combined values to the complex multiplier 22.

Figure 4:
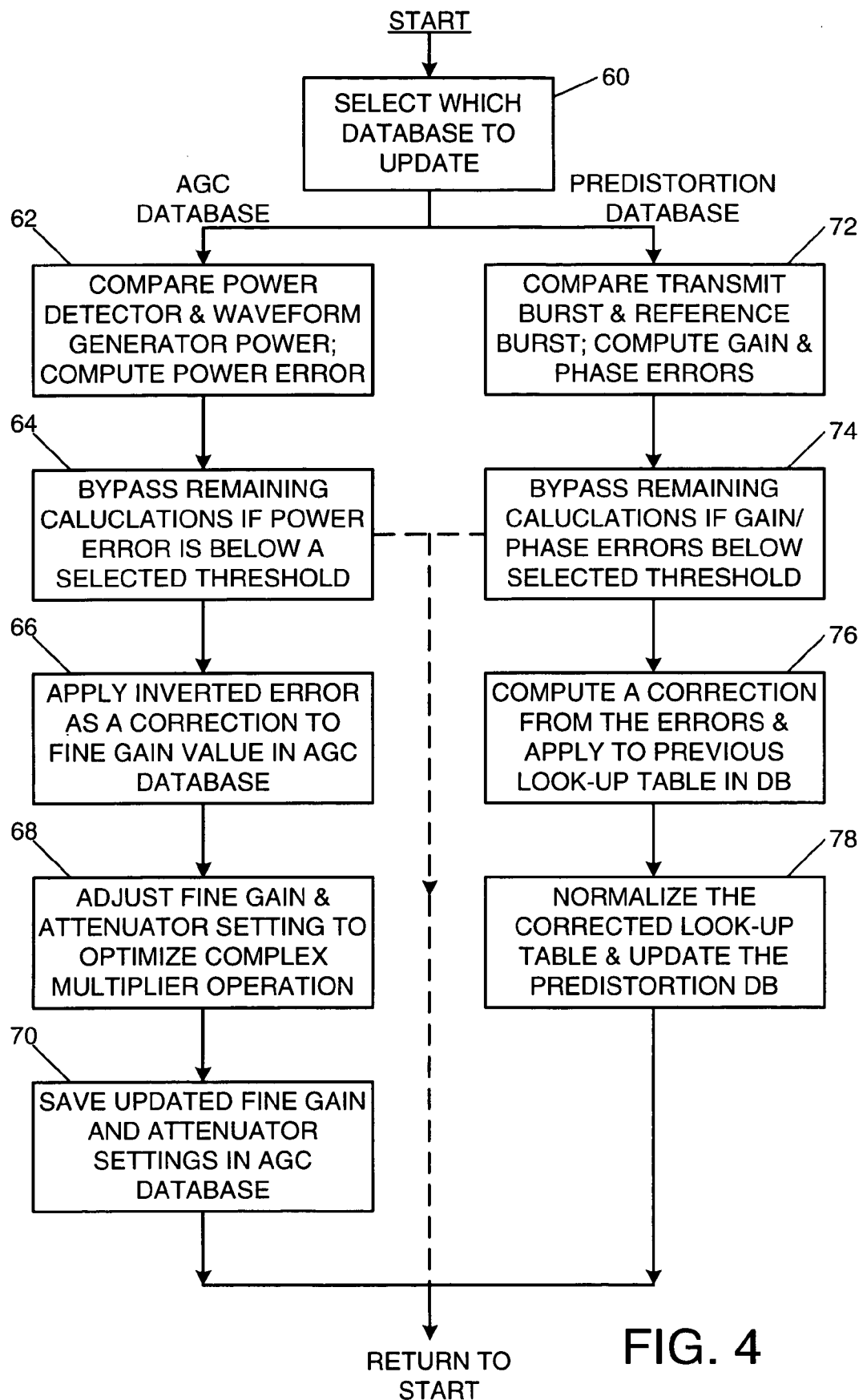
FIG. 4 is a flowchart showing the principal functions performed by a background processor of FIG. 2.

If the operating characteristics of the power amplifier 10 remained perfectly constant over time and in all environmental conditions, the real-time processor 26 could make the appropriate compensations to linearize the amplifier output and to maintain a desired amplifier gain. In practice, of course, the power amplifier 10 changes over time, requiring that both the databases 20 and 38 be updated to maintain the desired predistortion and gain control of the amplifier. The background processor 16 performs this function, as generally depicted in FIG. 4. The background processor 16 loops continuously through the functions to be described, the first function being selecting which of the two databases 20 and 38 to update next, as indicated in block 60. To utilize processing resources most efficiently, and to reduce cost, the background processor 16 updates both of the two databases 20 and 38 on some type of scheduling scheme. For example, a round-robin aging scheme may be used, where different aging values are assigned to the two databases 20 and 38, such that the relative priorities of the two types of database updates can be adjusted to optimize performance in a particular application. In addition to this programmable priority scheme for selecting which database to update, there may be a need to override this priority if certain conditions exist. For example, if a predistortion database update is scheduled but the power error is sensed to be very large, then priority is given to a power control update instead. Obviously, if efficiency of processor use were not an issue, the two databases 20 and 38 could be updated in parallel on a continuous basis, using parallel processors, but this would increase the complexity and cost of the hardware.

If the AGC database 38 is selected for updating, the background processor 16 first compares the power level obtained from the power detector 36 with the power level obtained from the waveform generator, and generates a power error signal, as indicated in block 62. Next, the background processor 16 compares this power error signal with a preselected threshold, as indicated in block 64. If the error signal is below the threshold, the processor skips the update and returns to the start of the process. If the power error signal is above the threshold, the background processor 16 applies the inverse of the error as a correction to the fine gain value retrieved from the AGC database 38, as indicated in block 66. Then the processor 16 adjusts the corrected fine gain value and an associated attenuator signal, as indicated in block 68, in order to optimize operation of the complex multiplier 22. Basically, this step of attenuation management is needed to ensure that complex multiplier 22 is operated to provide the maximum possible output that does not result in clipping. Finally, as indicated in block 70, the adjusted gain and attenuator settings are stored back in the AGC database 38 and the processing flow returns to block 60 to select a database to update, if it is time to do so.

If the predistortion database 20 is selected for updating in block 60, the next step is to compare a transmit burst obtained from output of the power amplifier 10 with a reference burst obtained from the waveform generator 18, as indicated in block 72, and gain and phase errors are computed. Before a comparison can be made, the two complex signals have to be similarly scaled. More specifically, the transmit root-mean-square (RMS) magnitude of the transmit burst signal is scaled to the RMS magnitude of the transmit burst signal. Also, the timing (correlation) of the two signals may be adaptively adjusted to compensate for variable delays due to such factors as temperature and aging. Next, in block 74, the gain and phase errors are compared with threshold error values. If the non-linearity gain and phase errors do not exceed their threshold, the remaining computations are bypassed and the processor 16 returns to the start of the sequence in block 60. If the non-linearity error is above the threshold, the processor 16 computes a correction and applies the correction to the corresponding values retrieved from the predistortion database 20, as indicated in block 76. The processor 16 then normalizes the corrected predistortion values, as indicated in block 78, and returns the values to the predistortion database 20. In the normalizing step, the processor effectively removes the linear gain managed by the AGC database updating steps.

The real-time processor 16 maintains and updates the databases 20 and 38 by monitoring the amplifier for output power error and predistortion error, and making appropriate adjustments to the databases. Accordingly, the present invention provides a new methodology for integrating the power control and predistortion functions in such a way that a cost effective implementation is possible for systems with the most complex baseband waveforms, while meeting stringent linearity and power control specifications. It will be apparent from this description and the accompanying drawings that the invention involves a hybrid architecture that is used to combine the benefits of the autonomous and integrated forms of power control for a predistortion system, while overcoming the limitations of each used separately. The amplifier circuit of the invention includes a predistortion architecture an integrated power control function, a processor to control real time operation, an architecture for structuring correction factor look-up tables (LUTs) that are separate from gain and pre-distortion databases, and a technique for both managing and making the updates to the power control and pre-distortion correction factors.

The following are some of the more important features of the invention:

1. The comparison of the reference and transmitted waveforms, including calibrated transmit waveform power detection, result in an amplitude and phase error array. An important aspect of the invention is that the gain error array is de-coupled into a linear and a nonlinear portion before further processing.

2. The invention maintains separate databases for the linear and nonlinear compensation values. Fine channel spacing is used in the power control database to store the small signal gain variation of the transmit channel. Relatively coarse channel spacing is used in the predistortion database to store the nonlinear correction factors. In the same manner, separate database spacings are used for power level, temperature, or other environmental/operational parameters that affect system performance.

3. In operation, the type and/or time sequence of the transmitted bursts is typically not controlled by the predistortion system. In order to efficiently utilize the processing resources, a round robin aging scheme is used to determine which bursts are to be processed, and whether to perform a power control or predistortion update. Different aging values for predistortion and power control are used and can be independently tuned to optimize system performance.

4. When scheduled for a predistortion update, the power error is checked before proceeding. If the power error is large, a power control update is performed instead of a predistortion update.

5. In the power control or predistortion update calculation, the remaining portion of the calculation is bypassed if the error is below a preselected threshold.

6. In the real-time processor 26, the predistortion and power control correction factors are combined to utilize the same complex multiplier for both updates.

7. In the power control update, the background processor 16 utilizes the predistortion maximum gain expansion value in that region of channels, to optimize the digital gain/RF attenuation for optimal digital-to-analog converter (DAC) dynamic range.

8. The predistortion nonlinear gain expansion being excessively large provides an independent method of determining that the output power is too high. If the power detector reports that the power is not correspondingly high, then the system provides an independent means for determining that the detector may be broken.

9. In the predistortion updates, the background processor 16 normalizes the nonlinear gain with respect to a reference amplitude which corresponds statistically to the mean power of the signal. In this way, predistortion updates optimally minimize the effect on the power control correction factors.

10. Gain compression becomes increasingly nonlinear up to the point of power amplifier saturation. Simply measuring the predistortion nonlinear error as a function of input amplitude, f(r), and calculating a correction factor as the inverse of the error results in a relatively large error after a single iteration. In accordance with another important aspect of the invention, and as discussed in more detail below, a better approach is to compute a compensation value that results in optimal gain convergence.

Figure 5:
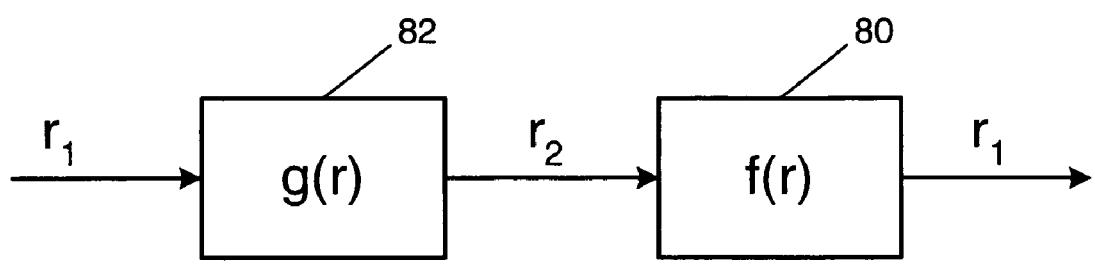
FIG. 5 is a block diagram showing the known relationship between an amplifier with nonlinearity and a predistortion step.

As shown in FIG. 5, an amplifier may be considered to apply a distorting nonlinear gain function f(r), as indicated in block 80, and to have a predistortion nonlinear gain function g(r) applied to its input signal of amplitude $r_1$, as indicated in block 82. Thus the input signal is predistorted to an amplitude $r_2$, where:

$$r_1 \cdot g(r_1) = r_2$$

Then, the predistorted signal $r_2$ is distorted by the amplifier nonlinearity, resulting in an output that, ideally, should be the same as the input signal $r_1$, neglecting, for the moment, the effect of the desired linear gain factor of the amplifier. In other words, the effect of the nonlinear gain factor of the amplifier may be expressed by:

$$r_2 \cdot f(r_2) = r_1$$

From the above two expression:

$$g(r_1) = r_2/r_1 = 1/f(r_2)$$

If, on startup, the predistortion gain g(r) is set to unity, then the first measured gain error (assuming no noise) would be exactly f(r). Traditionally, the compensating predistortion gain function is then set to $g(r) = f^{-1}(r)$, which results in a significant residual error, and the need for multiple iterations for the value of g(r) to converge on an appropriate solution. In accordance with one aspect of the present invention, the predistortion gain function is determined by solving for g(r) in the nonlinear equation:

$$g(r \cdot f(r)) = f^{-1}(r)$$

This results in rapid convergence, theoretically in one iteration, on the optimal solution for g(r). In practice, the solution may be obtained by interpolating the expression $1/r \cdot f^{-1}(r)$ for desired discrete reference amplitudes $r_i$ used in the predistortion table. The technique results in a much more rapid convergence of the error correction than if the traditional inverse error correction is used.

It will be appreciated from the foregoing that the present invention represents a significant advance in the field of power amplifiers used in RF transmitters. In particular, the invention efficiently integrates the functions of amplifier predistortion to compensate for nonlinearity, amplifier fine gain control, which is needed to handle communication waveforms that do not have a constant envelope. The advantages of the present invention include the following:

(1) There is a desired cost saving in the normally expensive analog transmit chain components, especially the power amplifier, because predistortion allow the amplifier to operated near its maximum power and because of performance improvements in power control and stricter out-of-band frequency control.

(2) At another level, there is also a cost reduction in the manner in which the predistortion and power control features are implemented. Specifically, using a single point in the transmit chain to effect both linear gain control and complex nonlinear gain control for predistortion, reduces the number of components needed to perform these functions. Also, the separation of a real-time look-up table from the dynamically updated databases effects an efficient integration of the two major functions. In a TDMA system, the look-up table is loaded right before each transmitted burst, and thus can be sized to hold only those correction factors needed for a single frequency and power level. This reduction in look-up table size reduces system complexity and cost, while allowing faster operation.

(3) The integrated architecture improves performance, by reducing the potential for momentary large errors in power control settings, and increases the speed of convergence.

It will also be appreciated that, although a specific embodiment of the invention has been described in detail for purposes of illustration, various modifications may be made without departing from the spirit and scope of the invention. Therefore, the invention should not be limited except as by the appended claims.

What is claimed is:

1. A method for integrating control of power and predistortion in a radio-frequency (RF) amplifier, the method comprising:
retrieving a set of gain and attenuator settings from an automatic gain control (AGC) database that contains a different set of gain and attenuator settings for each transmission type;
retrieving a set of predistortion parameters from a predistortion database that contains a different set of parameters for each transmission type;
applying the attenuator setting to attenuators associated with the amplifier;

combining the gain setting with the predistortion parameters to obtain a composite complex gain correction;

applying the composite complex gain correction to amplifier input signals, to effect predistortion and amplifier gain control;

continually updating the AGC database to reflect changes in amplifier performance due to aging and environmental conditions; and continually updating the predistortion database to reflect changes in amplifier performance due to aging and environmental conditions.

2. A method as defined in claim 1, and further comprising:

storing initial values in the AGC database and the predistortion database, based on typical values or on calibration of the amplifier after its manufacture.

3. A method as defined in claim 1, wherein the step of continually updating the AGC database comprises:

sensing the amplifier power output level;

comparing the amplifier power output level with a normalized power input level before the complex gain correction and attenuation, and generating from the comparison a power error;

computing a power correction from the power error;

retrieving a set of gain and attenuator settings from the AGC database;

applying the power correction to the gain setting retrieved from the AGC database;

adjusting the gain setting and associated attenuator setting to optimize the step of applying the composite complex gain correction; and saving the updated gain and attenuator settings back in the AGC database.

4. A method as defined in claim 3, and further comprising:

after the step of generating a power error, comparing the power error to a threshold level; and if the power error does not reach the threshold level, bypassing the remaining steps included in continually updating the AGC database.

5. A method as defined in claim 1, and further comprising:

prior to the steps of continually updating, selecting which database to update next, of the AGC database and the predistortion database.

6. A method as defined in claim 5, wherein the step of selecting which database to update next comprises:

selecting a database based on elapsed time following a prior selection of the same database.

7. A method as defined in claim 5, wherein the step of selecting which database to update next comprises:

alternating selection of the databases.

8. A method as defined in claim 5, wherein the step of selecting which database to update next comprises:

selecting the AGC database for update if the power error is above a programmable threshold, without regard to whether it may be appropriate to select the predistortion database based on another criterion.

9. A method as defined in claim 5, wherein a round-robin aging scheme is used to determine which database to update next and which transmission type data to update next within each database.

10. A method as defined in claim 1, wherein the step of continually updating the predistortion database comprises:

demodulating a transmit burst of signals coupled from the amplifier output;

comparing the demodulated transmit burst with a reference burst and computing from the comparison gain and phase errors;

computing gain and phase corrections from the gain and phase errors;

retrieving an appropriate portion of the predistortion database;

applying the computed gain and phase corrections to the retrieved portion of the predistortion database;

normalizing the corrections applied to the predistortion database; and updating the predistortion database to include the normalized corrections.

11. A method as defined in claim 10, and further comprising:

after the step of computing gain and phase errors, comparing the generated errors to programmable threshold levels; and if the gain and phase errors do not reach the threshold levels, bypassing the remaining steps included in continually updating the predistortion database.

12. A method as defined in claim 10, wherein the step of computing gain and phase corrections comprises:

solving for $g(r)$ in the nonlinear equation $g(r \cdot f(r)) = f^{-1}(r)$;

where $g(r)$ is the nonlinear gain function performed by predistortion, $f(r)$ is the nonlinear gain function of the RF amplifier, and $f^{-1}(r)$ is the inverse of the function $f(r)$.

13. A radio-frequency (RF) amplifier circuit having an integrated predistortion and power control architecture, the RF amplifier circuit comprising:

an automatic gain control (AGC) database that contains a different set of gain and attenuator settings for each amplifier gain level;

a predistortion database that contains a different set of gain and phase corrections for each transmission type;

a waveform generator for generating power amplifier input signals;

a complex multiplier for applying complex corrections to the input signals;

a transmit chain including attenuators for further adjusting the input signals;

a real-time processor for retrieving appropriate sets of correction data from the AGC database and the predistortion database, combining the correction data and applying correction signals to the complex multiplier and the attenuators;

a power detector for generating a signal representative of the output power of the amplifier;

a demodulator for demodulating samples of the amplifier; and a background processor for receiving output power signals from the power detector, transmit burst signals from the demodulator, and reference burst signals from the waveform generator, and for continually updating the AGC database and the predistortion database to reflect changes in amplifier performance due to aging and environmental conditions.

* * * * *